United States Patent
Choi et al.

(10) Patent No.: US 10,024,585 B2
(45) Date of Patent: *Jul. 17, 2018

(54) HEAT RADIATION-THERMOELECTRIC FIN, AND THERMOELECTRIC MODULE AND THERMOELECTRIC APPARATUS INCLUDING THE HEAT RADIATION-THERMOELECTRIC FIN

(71) Applicant: Samsung Electronics Co., Ltd., Suwon-Si, Gyeonggi-Do (KR)

(72) Inventors: Jae-young Choi, Suwon-si (KR); Seung-hyun Baik, Seoul (KR); Seung-hyun Hong, Seoul (KR); Won young Kim, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 398 days.

This patent is subject to a terminal disclaimer.

(21) Appl. No.: 14/018,752

(22) Filed: Sep. 5, 2013

(65) Prior Publication Data

US 2014/0060087 A1    Mar. 6, 2014

(30) Foreign Application Priority Data

Sep. 5, 2012    (KR) ........................ 10-2012-0098478

(51) Int. Cl.
*F25B 21/02*    (2006.01)
*H01L 35/16*    (2006.01)
(Continued)

(52) U.S. Cl.
CPC .............. *F25B 21/02* (2013.01); *H01L 35/16* (2013.01); *H01L 35/24* (2013.01); *H01L 35/32* (2013.01)

(58) Field of Classification Search
CPC .......... H01L 31/16; H01L 31/24; H01L 31/32
(Continued)

(56) References Cited

U.S. PATENT DOCUMENTS

| | | | | |
|---|---|---|---|---|
| 5,441,576 A | * | 8/1995 | Bierschenk | H01L 35/30 136/203 |
| 5,448,109 A | * | 9/1995 | Cauchy | H01L 35/16 257/64 |

(Continued)

FOREIGN PATENT DOCUMENTS

| | | |
|---|---|---|
| JP | 2010192780 A | 9/2010 |
| KR | 2011-0040055 A | 4/2011 |

OTHER PUBLICATIONS

Zhang et al., "Binding Graphene Sheets Together Using Silicon: Graphene/Silicon Superlattice", Nanoscale REs Lett. (2010) 5 pp. 805-808.*

(Continued)

*Primary Examiner* — Tae-Sik Kang
(74) *Attorney, Agent, or Firm* — Harness, Dickey & Pierce, P.L.C.

(57) ABSTRACT

A heat radiation-thermoelectric fin includes a thermoelectric inorganic material on a heterogeneous laminate of graphene. The heterogeneous laminate may be tube-shaped or plate-shaped, and a metal conductor may be coupled to one or more of the heterogeneous laminate. A thermoelectric module may be formed to include the fin, and a thermoelectric apparatus may include a heat supplier connected to the thermoelectric module.

14 Claims, 6 Drawing Sheets

(51) Int. Cl.
  *H01L 35/34* (2006.01)
  *H01L 35/32* (2006.01)
  *H01L 35/24* (2006.01)

(58) Field of Classification Search
  USPC .............................................. 62/3.7; 136/200
  See application file for complete search history.

(56) References Cited

U.S. PATENT DOCUMENTS

| | | | | |
|---|---|---|---|---|
| 9,070,824 | B2* | 6/2015 | Choi | H01L 35/22 |
| 2007/0095383 | A1* | 5/2007 | Tajima | C22C 12/00 |
| | | | | 136/238 |
| 2009/0277490 | A1 | 11/2009 | Chu | |
| 2010/0243018 | A1* | 9/2010 | Li | H01L 35/08 |
| | | | | 136/205 |
| 2011/0000224 | A1* | 1/2011 | Ghoshal | H01L 35/08 |
| | | | | 62/3.7 |
| 2011/0020969 | A1* | 1/2011 | Haa | H01L 35/08 |
| | | | | 438/54 |
| 2011/0099991 | A1* | 5/2011 | Stefan | H01L 35/08 |
| | | | | 60/320 |
| 2012/0024332 | A1* | 2/2012 | Stefan | H01L 35/32 |
| | | | | 136/200 |
| 2013/0167897 | A1* | 7/2013 | Choi | H01L 35/22 |
| | | | | 136/239 |
| 2014/0118380 | A1 | 5/2014 | Hakura et al. | |

OTHER PUBLICATIONS

Brian Shevitski, "Structural Properties of Graphene and Carbon Nanotubes", Sep. 28, 2010, [online], [retrieved on May 10, 2017]. Retrieved from the Internet:<URL: http://reu.physics.ucla.edu/common/papers/2010/shevitski_brian.pdf>, pp. 1-8.*

Kageshima, Hiroyuki, et al. "Theoretical Study on Magnetoelectric and Thermoelectronic Properties for Graphene Devices", Japanese Journal of Applied Physics, vol. 50, pp. 070115-1-0707115-5, 2011.

H. Hao, "Thermoelectric-Transport in Metal/Graphene/Metal Hetero-Structure", Chinese Physical Societ and IOP Publishing Ltd., vol. 19, No. 3, 2010.

Xiao, N., et al., "Enhanced Thermopower of Graphene Films with Oxygen Plasma Treatment," ACS NANO, vol. 5, No. 4, 2011, pp. 2749-2755.

Kanatzidis, M., "Nanostructured Thermoelectrics: The New Paradigm?" American Chemical Society-Chemistry of Materials Review, vol. 22, 2010, pp. 648-659.

Sootsman, J., et al., "New and Old Concepts in Thermoelectric Materials," Angewandte Chemie-Thermoelectric materials, vol. 48, 2009, pp. 8616-8639.

Su, C. Y., et al., "Transfer printing of graphene strip form the graphene grown on copper wires," Nanotechnology, vol. 22, No. 185309, 2011, pp. 1-6.

* cited by examiner

HEAT RADIATION-THERMOELECTRIC FIN, AND THERMOELECTRIC MODULE AND THERMOELECTRIC APPARATUS INCLUDING THE HEAT RADIATION-THERMOELECTRIC FIN

CROSS-REFERENCE TO RELATED APPLICATION

This application claims the benefit of Korean Patent Application No. 10-2012-0098478, filed on Sep. 5, 2012, in the Korean Intellectual Property Office, the disclosure of which is incorporated herein in its entirety by reference.

BACKGROUND

1. Field

The present disclosure relates to heat radiation-thermoelectric fins, and thermoelectric modules and thermoelectric apparatuses including the heat radiation-thermoelectric fins, and more particularly, to heat radiation-thermoelectric fins that have excellent thermoelectric conversion efficiency and are able to simultaneously perform heat radiation and thermoelectric generation, and thermoelectric modules and thermoelectric apparatuses including the heat radiation-thermoelectric fins.

2. Related Art

A thermoelectric phenomenon is a reversible, direct energy conversion from heat to electricity, and vice versa, which occurs by phonon transfer when electrons and holes move in a thermoelectric material. Examples of the thermoelectric phenomenon include the Peltier effect and the Seebeck effect.

The Peltier effect is used in a cooling system operating based on a temperature difference at opposite ends of a material. The temperature difference is produced based on an applied current. The Seebeck effect is used in a power-generation system operating based on an electromotive force generated by a temperature difference at opposite ends of a material. A thermoelectric material is used in a semiconductor apparatus of which heating-related problems are not addressed by using a passive cooling system, and in an active cooling system for an electronic device. In addition, demands for use of a thermoelectric material in cooling applications where a conventional refrigerant gas compression method is not effective have increased.

Thermoelectric cooling is an environmentally friendly non-vibration and low-noise cooling technology that does not use a refrigerant which causes environmental problems. If a highly efficient thermoelectric cooling material is developed, the application range of such thermoelectric material may include generally used cooling systems such as refrigerators and air conditioners. In addition, if a thermoelectric power generation material is used in a heat dissipating portion in an automobile engine or an industrial factory, such use may enable power generation due to a temperature difference at opposite ends of a material. Accordingly, thermoelectric power generation materials are regarded as a novel regeneration energy source. In order to provide a temperature difference at opposite ends of a thermoelectric apparatus, a heat supplier may be connected to one end of a thermoelectric device while a heat radiation unit including a heat radiation fin may be connected to another end. The heat radiation fin is provided separately from the thermoelectric device, and as a result the size of the thermoelectric apparatus may be increased along with its cost of manufacture.

SUMMARY

Provided are heat radiation-thermoelectric fins that have excellent thermoelectric conversion efficiency and are able to simultaneously perform heat radiation and thermoelectric generation.

Provided are electric modules including the heat radiation-thermoelectric fins.

Provided are thermoelectric apparatuses including the electric modules.

Additional aspects will be set forth in part in the description which follows and, in part, will be apparent from the description, or may be learned by practice of the presented embodiments.

According to an aspect of the present invention, a heat radiation-thermoelectric fin includes a heterogeneous laminate of graphene and a thermoelectric inorganic material.

According to another aspect of the present invention, a thermoelectric module includes a heat transfer member; and a heat radiation-thermoelectric fin having one end connected to the heat transfer member.

According to another aspect of the present invention, a thermoelectric apparatus includes a heat supplier; and a thermoelectric module.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

In the drawings, it is understood that the thicknesses of layers and regions may be exaggerated for clarity. It will also be understood that when a layer is referred to as being "on" another layer or substrate, it can be directly on the other layer or substrate or intervening layers may also be present. Like reference numerals in the drawings denote like elements, and thus their description will not be repeated. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved According to an example embodiment, a heat radiation-thermoelectric fin includes a heterogeneous laminate of graphene and a thermoelectric inorganic material. These and other example embodiments are described below.

Figure 1A:
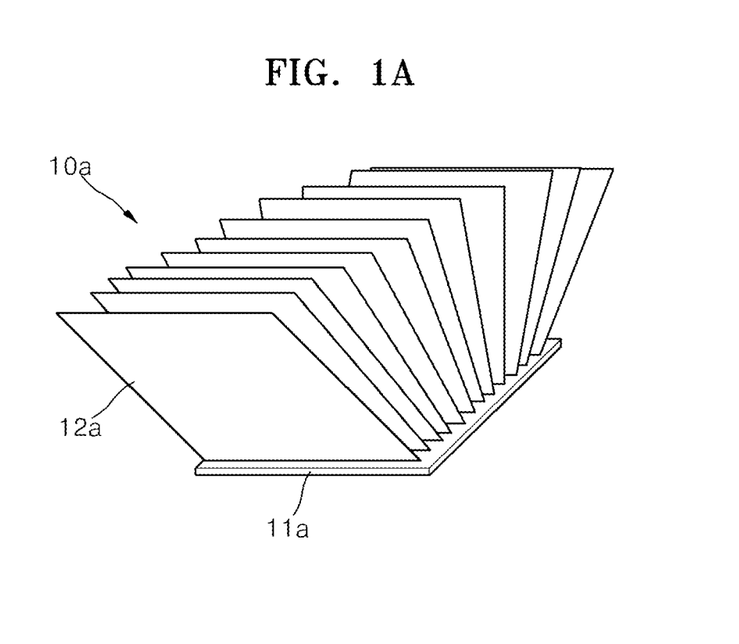
FIGS. 1A and 1B are schematic views respectively illustrating various types of heat radiation fins used in a thermoelectric device.
Figure 1B:
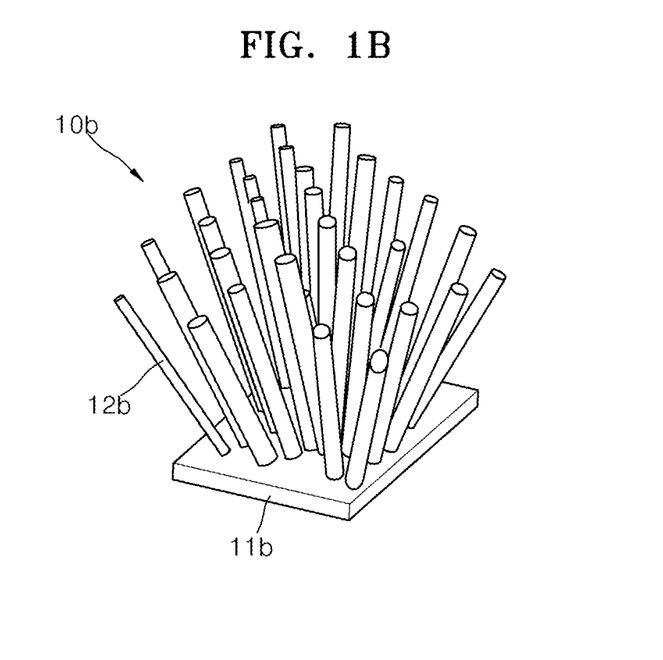

FIGS. 1A and 1B are schematic views respectively illustrating various types of heat radiation fins for a thermoelectric device. Referring to FIGS. 1A and 1B, heat radiation fin units 10a and 10b used in a thermoelectric apparatus only perform the function of heat radiation. Accordingly, each unit has a structure of a plurality of plate-shaped or tube-shaped heat radiation fins 12a and 12b respectively connected to heat radiation fin plates 11a and 11b. For effective heat radiation, the heat radiation fins have a shape that may increase a surface area thereof and include a thermal conductive metal such as copper, aluminum, or an alloy thereof.

A heat radiation-thermoelectric fin according to an example embodiment includes a heterogeneous laminate of graphene and a thermoelectric inorganic material. This fin not only performs the function of heat radiation, but also thermoelectric power generation.

A heat radiation-thermoelectric fin according to another example embodiment may further include a metal substrate on which a heterogeneous laminate of graphene and a thermoelectric inorganic material is formed.

A heat radiation-thermoelectric fin according to another example embodiment may have a plurality of tube-shaped or plate-shaped fins. In the case of a plate-shaped heat radiation-thermoelectric fin, the metal substrate may be a metal plate on which a heterogeneous laminate of graphene and a thermoelectric inorganic material is formed. In the case of a tube-shaped heat radiation-thermoelectric fin, the metal substrate may be a metal wire surrounded by a heterogeneous laminate of graphene and a thermoelectric inorganic material. According to one example, some parts of graphene may not be surrounded by the thermoelectric inorganic material, but may be exposed in the heterogeneous laminate. Alternatively, in another example all parts of the graphene may be surrounded by the thermoelectric inorganic material. The metal substrate may serve to transfer heat to the heterogeneous laminate of graphene and the thermoelectric inorganic material.

Figure 2A:
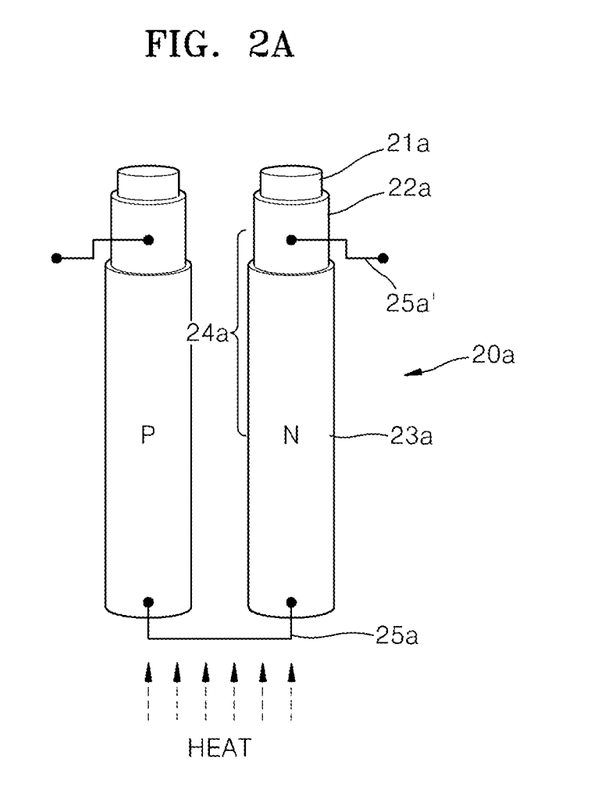
FIGS. 2A and 2B are schematic views respectively illustrating example embodiments of a heat radiation-thermoelectric fin.
Figure 2B:
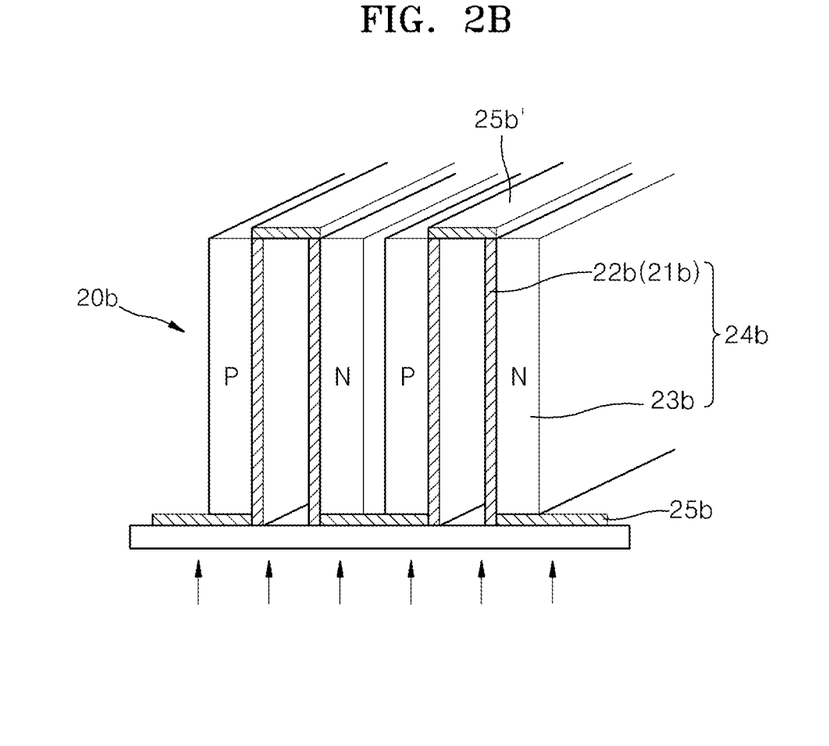

FIGS. 2A and 2B are schematic views respectively illustrating example embodiments a heat radiation-thermoelectric fin, according to an embodiment of the present invention. FIG. 2A illustrates one embodiment of a tube-shaped heat radiation-thermoelectric fin, and FIG. 2B illustrates another embodiment of a plate-shaped heat radiation-thermoelectric fin.

The tube-shaped heat radiation-thermoelectric fin 20a has a metal wire 21a that is surrounded by a heterogeneous laminate 24a of graphene 22a and a thermoelectric inorganic material 23a. A plurality of these tubed fins may be connected in series to each other by conducting wires 25a and 25a'. The plate-shaped heat radiation-thermoelectric fin 20b has a heterogeneous laminate 24b of graphene 22b and a thermoelectric inorganic material 23b formed on top of a metal plate 21b.

A plurality of these plates may be connected in series to each other by metal electrodes 25b and 25b'.

The metal substrate (which, for example, may be a metal wire or a metal plate) may have a temperature gradient from a side closest to a heat supplier to a far side from the heat supplier, or from a high temperature to a low temperature, and operates as a heat passage in the heat radiation-thermoelectric fin. Accordingly, the thermoelectric inorganic materials 23a and 23b formed around the metal wire 21a or on top of the metal plate 21b also have a temperature gradient to generate electromotive force.

Figure 3:
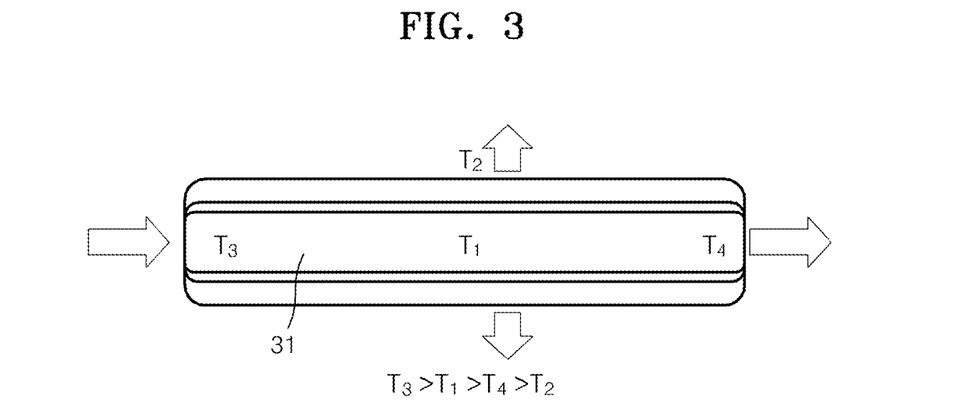
FIG. 3 is a view illustrating a temperature gradient that may be formed in a longitudinal section of an example embodiment of a tube-shaped heat radiation-thermoelectric fin.

FIG. 3 is a view illustrating an example of a temperature gradient in a longitudinal section of a tube-shaped heat radiation-thermoelectric fin. In a metal wire 31, a temperature T3 at a side closest to a heat supplier is higher than a temperature T4 at a side farther away from the heat supplier. Accordingly, movement of electrons and holes in a thermoelectric inorganic material 43 occurs from the side closest to the heat supplier to the side far therefrom, as illustrated, for example, in FIG. 4

Figure 4:
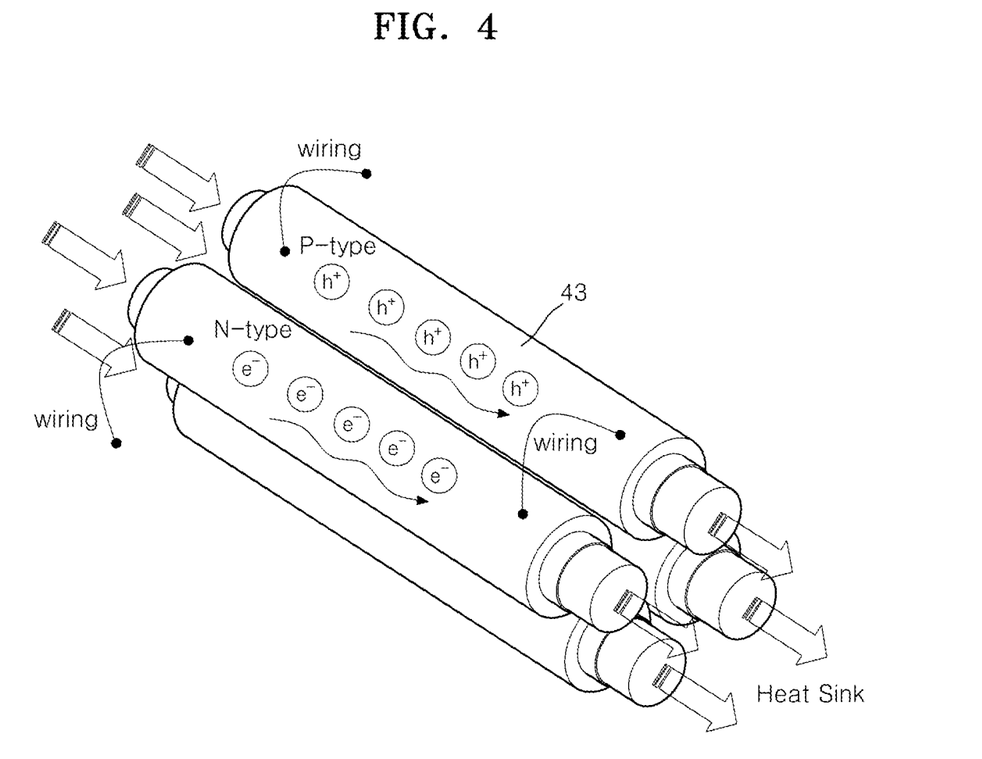
FIG. 4 is a view illustrating movement of carriers in an example embodiment of a tube-shaped heat radiation-thermoelectric fin.
Figure 5:
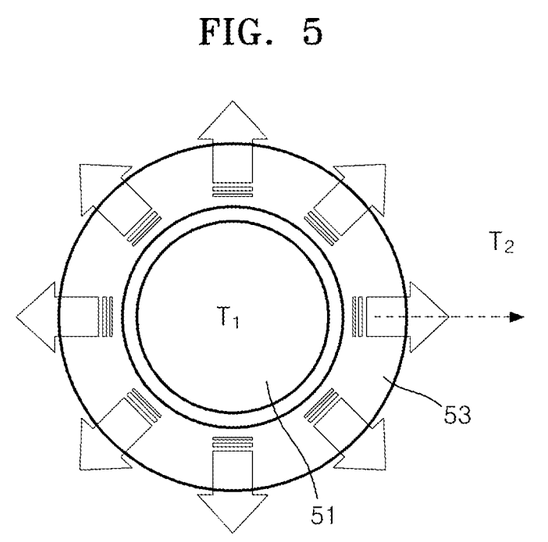
FIG. 5 is a view illustrating a temperature gradient in a cross-section of an example embodiment of a tube-shaped heat radiation-thermoelectric fin.

FIG. 5 is a view illustrating an example of a temperature gradient in a cross-section of a tube-shaped heat radiation-thermoelectric fin. In a metal wire 51, a temperature T1 is higher than an atmosphere temperature T2. Accordingly, a temperature gradient is formed from the metal wire 51 to an external thermoelectric inorganic material 53, as a temperature gradient from a high temperature to a low temperature. Therefore, as illustrated in FIG. 4, movement of electrons and holes occurs from the inside of the heat radiation-thermoelectric fin to the outside thereof.

According to the same principle as indicated above, movement of electrons and holes due to a temperature difference in a heat radiation-thermoelectric fin may lead to power generation, and in addition a large surface area of a heat radiation-thermoelectric fin may lead to effective heat radiation.

The metal substrate on which the heterogeneous laminate of graphene and the thermoelectric inorganic material is formed may be any thermal conductive metal, for example, copper, aluminum, or an alloy thereof.

When graphene as a material having high electrical conductivity and mobility is used with a thermoelectric inorganic material to form a heterogeneous laminate, the thermoelectric inorganic material may have improved thermoelectric function due to graphene's excellent electrical properties.

In accordance with example embodiments, the characteristics of a thermoelectric material may be evaluated using a dimensionless thermoelectric figure of merit ZT defined by Equation 1:

$$ZT=(S^2\sigma T)/k \qquad (1)$$

where S is a Seebeck coefficient, σ is an electrical conductivity, T is an absolute temperature, and k is a thermal conductivity. As illustrated in Equation 1, to increase the figure of merit ZT of the thermoelectric material, a large Seebeck coefficient and a high electrical conductivity (that is, a large power factor ($S^2\sigma$) and a low thermal conductivity) may be provided.

Graphene has a two-dimensional planar structure of a honeycomb shape in which carbon atoms are connected to each other in a hexagonal shape and has excellent electrical property due to its high charge mobility. Regarding the thermoelectric characteristics of graphene, movement of phonons is blocked in an out-of-plane direction (a direction perpendicular to a planar-structure graphene) due to their scattering. As a result, the thermal conductivity characteristics of graphene may be lower than in an in-plane direction (within the planar structure of graphene). Accordingly, due to these in-plane or out-of-plane characteristics of graphene, when graphene is used in a thermoelectric material, the thermoelectric material may have high electrical conductivity and low thermal conductivity. Thus, the characteristics of the formed thermoelectric material may be improved.

By alternately stacking graphene and a thermoelectric inorganic material, high electrical conductivity and low thermal conductivity in an out-of-plane direction may be constructed, and thus the graphene heterogeneous laminates according to one example embodiment may have a thermoelectric effect in a tube length direction as well as in a tube cross-sectional direction.

A heterogeneous laminate may be formed by forming the thermoelectric inorganic material, for example, a nano-film thermoelectric inorganic material, on graphene. A heterogeneous laminate may have a multi-layer structure formed by alternately repeatedly stacking graphene and a thermoelectric inorganic material once to 100 times, for example.

Graphene used in a heterogeneous laminate is a polycyclic aromatic molecule formed by covalently bonding a plurality of carbon atoms, wherein the covalently bonded carbon atoms may form a 6-membered ring as a repeating unit. Also, graphene may further include a 5-membered ring and/or a 7-membered ring.

Accordingly, graphene is considered to be a single layer of covalently bonded carbon atoms (conventionally, a sp2 bond). Graphene may be a single layer or a multi-layer formed by stacking several single layers. The multi-layer may have about 1 to 300 single layers, or about 2 to 100 single layers, or about 3 to 50 single layers. In the case of a multi-layered graphene, phonons are scattered due to interlayer interfaces, and thus, the thermoelectric inorganic material may have a better thermoelectric characteristic in the out-of-plane direction.

Also, if graphene is a multi-layer, graphene may have various stack structures such as an AB-stacking or a random-stacking structure. In particular, the random-stacking structure may be advantageous compared to the AB-stacking structure in terms of blocking phonons in the out-of-plane direction, and carrier mobility and electrical conductivity.

Graphene may be prepared by using various manufacturing methods, for example, an exfoliation process or a growth process.

A thermoelectric inorganic material is stacked to form a heterogeneous laminate on the graphene prepared as described above. A thermoelectric inorganic material may be any one of various materials used in the art. For example, a thermoelectric inorganic material may be at least one selected from the group consisting of a transition metal, a rare earth element, a Group 13 element, a Group 14 element, a Group 15 element, or a Group 16 element.

The rare earth element may be Y, Ce, La, or the like, the transition metal may include at least one of Ti, Zr, Hf, V, Nb, Ta, Cr, Mo, W, Mn, Fe, Co, Ni, Cu, Zn, Ag, and Re, the Group 13 element may include at least one of B, Al, Ga, and In, the Group 14 element may include at least one of C, Si, Ge, Sn, and Pb, the Group 15 element may include at least one of P, As, Sb, and Bi, and the Group 16 element may include at least one of S, Se, and Te.

Examples of the thermoelectric inorganic material including such elements are a Bi—Te-based compound, a Co—Sb-based compound, a Pb—Te-based compound, a Ge—Tb-based compound, a Si—Ge-based compound, a Bi—Sb—Te-based compound, a Sb—Te-based compound, a Sm—Co-based compound, and a transition metal silicide-based compound. The electrical characteristics of the thermoelectric inorganic materials may be improved by including at least one element selected from the group consisting of the transition metal, the rare earth element, the Group 13 element, the Group 14 element, the Group 15 element, and the Group 16 element as a dopant.

An example of the Bi—Te-based thermoelectric inorganic material is a $(Bi,Sb)_2(Te,Se)_3$-based thermoelectric inorganic material in which Sb and Se are used as a dopant. An example of the Co—Sb-based thermoelectric inorganic material is a $CoSb_3$-based thermoelectric inorganic material.

Examples of the Sb—Te-based thermoelectric inorganic material are $AgSbTe_2$ and $CuSbTe_2$, and those of Pb—Te-based thermoelectric inorganic material are PbTe and (PbTe)$mAgSbTe_2$.

A heterogeneous laminate of the graphene and thermoelectric inorganic material may be formed as follows. First, graphene is formed on a substrate, and a film of a thermoelectric inorganic material is formed on the graphene. The method of forming the graphene on the substrate may be a growth process or an exfoliation process known to one of ordinary skill in the art. Any graphene may be used, and examples are graphene having a monocrystalline structure or a polycrystalline structure, or epitaxially grown graphene, or the like. Such graphene may have about 1 layer to about 300 layers.

In an exfoliation process as an example of the method to prepare the graphene, the graphene is separated by using a mechanical means (e.g., scotch tape) or an oxidation-reduction process from a material that has a graphene structure therein. An example of such material is graphite or highly oriented pyrolytic graphite (HOPG).

In a growth process as another example of the method to prepare the graphene, carbon included in or adsorbed on the inorganic material such as silicon carbide is grown on the surface of the inorganic material at a high temperature, or a carbon supplier such as methane or ethane is dissolved in or adsorbed on a catalyst layer such as a nickel or copper film at a high temperature, followed by a cooling process to crystallize carbon on the surface of the catalyst layer to form a graphene crystal structure.

Such graphene may, for example, have a large area of 1 $cm^2$ or more, and the shape thereof may be constantly manufactured. Also, the number of layers that constitute the graphene may be easily controlled by changing a kind and a thickness of a substrate and a catalyst, a reaction time, a cooling rate, or a concentration of a reaction gas. As a result, graphene may be produced with an excellent reproducibility and on a large scale by using a growth process. The growth process may be any one of various methods used in the art.

As the substrate on which the graphene is formed, an inorganic substrate including at least one of a Si substrate, a glass substrate, a GaN substrate, or a silica substrate; or a metal substrate including at least one of Ni, Co, Fe, Pt, Pd, Au, Al, Cr, Cu, Mn, Mo, Rh, Ir, Ta, Ti, W, U, V or Zr; or the like may be used.

When the graphene is formed on the substrate as described above, the thermoelectric inorganic material film is stacked on the graphene. Such thermoelectric inorganic material film may be formed by exfoliating the film from the particulate thermoelectric inorganic material, or by directly growing the thermoelectric inorganic material film on the graphene.

As a growth process for growing the thermoelectric inorganic material on the graphene to obtain the thermoelectric inorganic material film, the thermoelectric inorganic material may be formed in a film shape having a nano-scale thickness of, for example, about 0.1 nm to about 1 cm on the graphene by, for example, deposition. The deposition method is not limited, and may be a physical deposition method such as evaporation or sputtering, a chemical vapor deposition (CVD) such a metal-organic material CVD or hydride vapor phase epitaxy, or a microwave-induced chemical vapor deposition.

As an exfoliation process to prepare the thermoelectric inorganic material film, tape exfoliation or an ultrasonic dispersion exfoliation process may be used.

The thermoelectric inorganic material may have a polycrystalline structure or a monocrystalline structure.

The thermoelectric inorganic material obtained by using the deposition described above may be grown in an epitaxial structure on the graphene. Such epitaxial growth means that the thermoelectric inorganic material is stacked in a direction that is identical to the crystal axis of the graphene. Thus, when the graphene has a polycrystalline structure, the thermoelectric inorganic material formed thereon may also have a polycrystalline structure.

When the thermoelectric inorganic material having a monocrystalline structure is formed on the graphene, nanoparticles of the exfoliated thermoelectric inorganic material may be used. In addition, the thermoelectric inorganic material film having a monocrystalline structure may be obtained by tape exfoliation or an ultrasonic dispersion exfoliation process, followed by alternately stacking on the graphene.

When the thermoelectric inorganic material is formed in a film shape on the graphene by a growth process, the thermoelectric inorganic material may be formed to have a constant orientation on the interface of the graphene. That is, when the thermoelectric inorganic material is formed in a form of a nano film on the graphene by, for example, deposition, due to an interaction between a crystal structure of the graphene and the thermoelectric inorganic material formed thereon, the thermoelectric inorganic material may have a regular crystal structure, and thus, may have a constant orientation.

The crystal orientation of the thermoelectric inorganic material film formed on the graphene may be measured by X-Ray Diffraction (XRD), and it was confirmed from the XRD measurement results that the thermoelectric inorganic material film has a 00l surface (where l is an integer from 1 to 99).

The crystal orientation of the 00l surface of the thermoelectric inorganic material film may contribute to various physical properties of the out-of-plane direction. That is, because the thermoelectric inorganic material film formed on the graphene has a constant orientation, a crystal property and an electron structure thereof are changed at the interface between the graphene having a metallic property and the thermoelectric inorganic material having a semiconductor property, and thus, the Seebeck coefficient is increased and transmission of charge particles are accelerated to increase electrical conductivity and charge mobility.

Also, the phonon scattering at the interface between the graphene and the thermoelectric inorganic material is enhanced, thereby enabling control of the thermal conductivity.

Also, because the thermoelectric inorganic material is formed to have a nano-scale size, a quantum confinement effect may be induced, and also, due to the confinement of phonon in a nano film (phonon glass electron crystal (PGEC) concept), thermal conductivity may be lowered.

The quantum confinement effect means that the density of state of a carrier in a material is increased to increase an effective mass, thereby increasing the Seebeck coefficient while the electrical conductivity is not significantly changed, and breaking down the interrelationship between the electrical conductivity and the Seebeck coefficient. The PGEC concept means that the flow of phonons that deliver heat is blocked and the flow of a carrier is not blocked, thereby reducing the thermal conductivity only.

As described above, the out-of-plane direction is a spatial direction that is distinguished from the in-plane direction of the graphene having a planar structure, and means a direction (z axis) perpendicular to a plane (x-y axis). If the heterogeneous laminate of the graphene and the thermoelectric inorganic material has a tube shape, the out-of-plane direction is a direction (a direction perpendicular to the tangent of the external diameter of the tube) perpendicular to a circumferential direction of the tube (in-plane direction of graphene).

In the out-of-plane direction, the thermoelectric inorganic material having a crystal property may be stacked.

The heterogeneous laminate of the graphene and the thermoelectric inorganic material may be obtained by stacking the thermoelectric inorganic material on the graphene. In this case, the heterogeneous laminate may have a superlattice structure.

The heterogeneous laminate of the graphene and the thermoelectric inorganic material may be formed by stacking the thermoelectric inorganic material film on the graphene and this stacking is repeatedly performed to form the multi-layer heterogeneous laminate. That is, the thermoelectric inorganic material film is formed on the graphene, and then, the graphene is stacked on the thermoelectric inorganic material film, and then, a thermoelectric inorganic material film is formed thereon, and this alternate stacking is performed to form the heterogeneous laminate including a unit of graphene/thermoelectric inorganic material. The heterogeneous laminate may include, for example, about 1 to 100 units of the graphene/thermoelectric inorganic material.

The thermoelectric inorganic material in the heterogeneous laminate may have a thickness of about 0.1 nm to about 1 cm.

In the heterogeneous laminate of the graphene and the thermoelectric inorganic material, the thermoelectric inorganic material may have a p-type semiconductor property or an n-type semiconductor property. The graphene may be doped with a p-dopant or an n-dopant.

A heat radiation-thermoelectric fin in the form of a tube or a plate may be manufactured by forming the heterogeneous laminate of the graphene and the thermoelectric inorganic material to surround the metal wire or to cover the metal plate as described above.

If the graphene is grown by using a thermally conductive metal wire or a plate as a substrate, a thermoelectric inorganic material film may be formed on the graphene that is grown on the metal wire or the metal plate to manufacture the heat radiation-thermoelectric fin according to another embodiment of the present invention. A thickness of the metal wire in the tube-shaped heat radiation-thermoelectric fin may not be limited unless it enables optimization of the growth conditions of the graphene. The thickness of the metal wire may be between about 1 nm to several centimeters.

A full-length of the tube-shape heat radiation-thermoelectric fin is not significantly different from that of a conventional heat radiation fin. The full-length may be between about 1 nm to several centimeters.

If the heterogeneous laminate of the graphene and the thermoelectric inorganic material in the plate-shaped heat radiation-thermoelectric fin is formed on both sides of the metal plate, the heat radiation-thermoelectric fin may be manufactured by repeating the process above.

The plate-shaped heat radiation-thermoelectric fin is not significantly different from a conventional heat radiation fin with regard to size. For example, the size of the heat radiation-thermoelectric fin may be as large as 1 μm×1 μm to 10 cm×10 cm.

A thermoelectric module according to an embodiment of the present invention includes a heat transfer member, and a heat radiation-thermoelectric fin having one end is connected to the heat transfer member, the heat radiation-thermoelectric fin including a heterogeneous laminate comprising graphene and a thermoelectric inorganic material.

The heat transfer member may be formed, for example, of copper, aluminum, nickel, or an alloy thereof.

As previously indicated, the heat radiation-thermoelectric fin may have a structure of a plurality of tubes or plates. The heat radiation-thermoelectric fin may further include a metal substrate on which the heterogeneous laminate of the graphene and the thermoelectric inorganic material is formed.

If the heat radiation-thermoelectric fin is tube-shaped, the metal substrate may be in the form of a metal wire of which circumference is surrounded by the heterogeneous laminate of the graphene and the thermoelectric inorganic material.

If the heat radiation-thermoelectric fin is plate-shaped, the metal substrate may be in the form of a metal plate on which the heterogeneous laminate of the graphene and the thermoelectric inorganic material is formed.

The metal substrate may transfer heat to the heterogeneous laminate of the graphene and the thermoelectric inorganic material.

A method to connect one end of the heat radiation-thermoelectric fin to the heat transfer member may be performed, for example, by forming an insertion groove in one end to which heat is transferred in order to insert the heat radiation-thermoelectric fin therein.

Figure 6A:
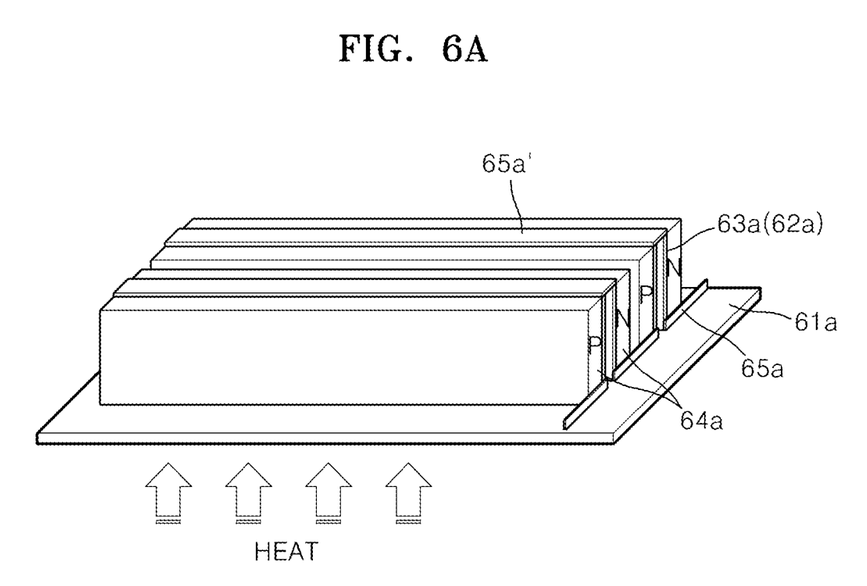
FIGS. 6A and 6B are schematic views schematically illustrating an example embodiment of a thermoelectric module.
Figure 6B:
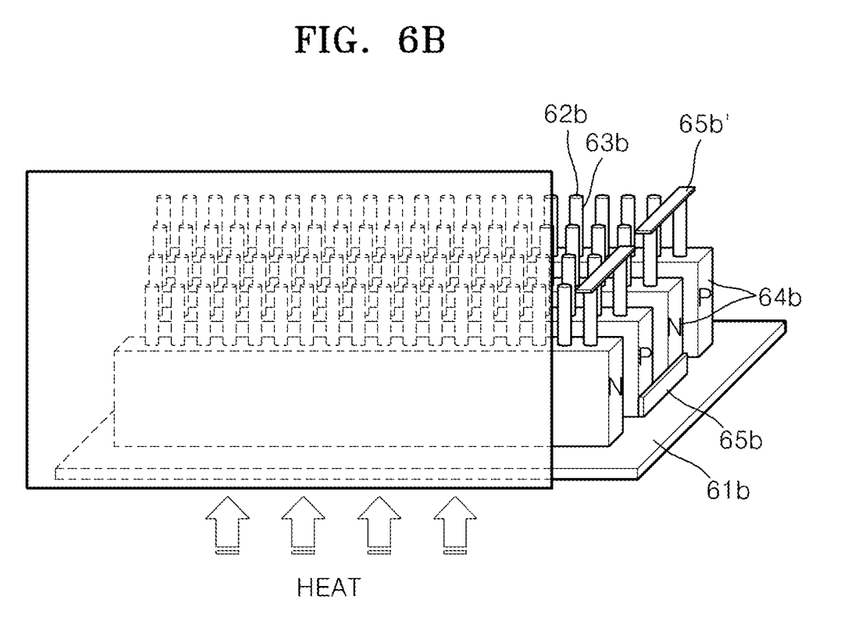

FIG. 6A is a schematic view illustrating an example embodiment of a thermoelectric module including a plate-shaped heat radiation-thermoelectric fin, and FIG. 6B is a schematic view illustrating an example embodiment of a thermoelectric module including a tube-shaped heat radiation-thermoelectric fin.

Heat transfer units 61a and 61b are exposed to a heat supplier and are connected to a metal plate 62a or a metal wire 62b to transfer heat. A plurality of plates or tubes are connected in series to each other by metal electrodes 65a, 65a', 65b, and 65b', respectively.

In the case of the plate-shaped heat radiation-thermoelectric fin shown in FIG. 6A, p-type thermoelectric elements are connected to n-type thermoelectric elements on the same metal plate via the metal electrode 65a. This is followed by a connection to the neighboring p-type thermoelectric elements on the neighboring metal plate by the metal electrode 65a', which is then followed by a connection to the n-type thermoelectric elements on the same metal plate by the metal electrode 65a. This is followed by a connection to the neighboring p-type thermoelectric elements by the metal electrode 65a' again.

Thus, the p-type thermoelectric elements and n-type thermoelectric elements are alternately connected repeatedly. The thermoelectric elements at the two most distal ends of the plates are connected to lead electrodes. The heat radiation-thermoelectric fin is accordingly connected to the outside via the lead electrodes.

In the case of the tube-shaped heat radiation-thermoelectric fin shown in FIG. 6B, p-type thermoelectric elements are connected to neighboring n-type thermoelectric elements via the metal electrode 65b. This is followed by a connection to the neighboring p-type thermoelectric elements by the metal electrode 65b'. Therefore, the p-type thermoelectric element and the n-type thermoelectric element are alternately connected with the metal electrodes 65b and 65b', and the thermoelectric elements of the two most distal ends of the tubes are connected to lead electrodes.

In the thermoelectric module, the heat radiation-thermoelectric fin may be connected to the heat transfer member in various ways. For example, if the heat transfer member is a bar, the heat radiation-thermoelectric fin may have a radial form with respect to the heat transfer member. In addition, the heat radiation thermoelectric fin may be arranged in a row on one side of the heat transfer member.

In the thermoelectric module, at least one of the p-type thermoelectric elements and the n-type thermoelectric elements may be the heterogeneous laminate of the graphene and the thermoelectric inorganic material.

The heterogeneous laminate of the graphene and the thermoelectric inorganic material may operate as the p-type thermoelectric elements. Any n-type thermoelectric material known to one of ordinary skill in the art may be used for the n-type thermoelectric elements.

The metal wires or the metal electrodes may include copper, aluminum, nickel, an alloy thereof, or the like.

The thermoelectric apparatus according to another example embodiment includes a heat supplier and the thermoelectric module described above. A heat transfer member in the thermoelectric module may be exposed to the heat supplier.

Heat is transferred to the heat transfer member by the heat supplier, and to the heat radiation-thermoelectric fin connected to the heat transfer member again. A temperature gradient occurs in a length direction of a metal wire or a metal plate of the heat radiation-thermoelectric fin. Due to such temperature gradient, flows of holes and electrons from a thermoelectric inorganic material may occur, and the heat radiation-thermoelectric fin may be electrically connected to the outside of the thermoelectric module to an electronic device (e.g., a battery) that consumes or saves power via lead electrodes.

The heat supplier may supply heat recovered from waste heat caused by electronic products, home appliances, automobiles, buildings, or the like.

Meanwhile, since the heat radiation-thermoelectric fin according to another embodiment is connected to electrodes, the heat radiation-thermoelectric fin may provide a cooling effect when a current is applied thereto. Such cooling effect may be used for cooling the semiconductor device and substrate. Examples of the various embodiments are described below.

Example 1: Thermoelectric Modules Including Tube-Shaped Heat Radiation-Thermoelectric Fins Graphene (having 1 to 10 layers) was formed by a chemical vapor deposition method on a copper wire having a diameter of 50 μm and a length of 1 cm. Then, a Sb2Te3 thermoelectric inorganic material was formed to a thickness of 10 nm on the graphene by using a sputtering process. During sputtering, a rotation speed of the wire was 50 rpm, a wire temperature was maintained at 200° C., a pressure was maintained at 3 mTorr, and Ar plasma was used. A Sb2Te3 alloy was used as a target material, and a power of 30 W was supplied.

Twelve heat radiation-thermoelectric fins manufactured by the methods described above were connected to insert them into a groove formed in one side of a plate used as a heat transfer member. The heat radiation-thermoelectric fins were connected by using metal electrodes, and lead electrodes were respectively connected to two most distal ends of the tube-shaped thermoelectric elements.

Example 2: Thermoelectric Modules Including Plate-Shaped Heat Radiation-Thermoelectric Fins Graphene (having 1 layer) was formed by a chemical vapor deposition method on a copper plate having an area of 1.5 cm×1.5 cm. Then, a Sb2Te3 thermoelectric inorganic material was formed to a thickness of 10 nm on the graphene by using a sputtering process. During the sputtering, a rotation speed of the wire was 50 rpm, a wire temperature was maintained at 200° C., a pressure was maintained at 3 mTorr, and Ar plasma was used. A Sb2Te3 alloy was used as a target material, and a power of 30 W of was supplied.

Four heat radiation-thermoelectric fins were placed at one end of the plate that was used as a heat transfer member, and the heat radiation-thermoelectric fins were connected therebetween by using metal electrodes. Lead electrodes were respectively connected to two most distal ends of the plate-shaped thermoelectric elements.

Comparative Example 1: Thermoelectric Modules Including Conventional Heat Radiation Fins and Thermoelectric Materials A Sb2Te3 alloy as a thermoelectric inorganic material was formed by sputtering to a thickness of 10 nm on an oxidized high-resistance p-doped Si wafer having an area of 1.2 cm×1.2 cm and including a 300 nm SiO2 layer. During the sputtering, a wafer rotation speed was 50 rpm, a wafer temperature was 200° C., a pressure was maintained at 3 mTorr, and Ar plasma was used. A Sb2Te3 alloy was used a target material, and a power of 30 W of was supplied. COOLERTEC CT-3523G, which is a commercial product made of aluminum, was used as a heat radiation fin.

Experimental Example 1: Electrical Conductivity Measurement (an in Plane Direction and an Out of Plane)

Figure 7:
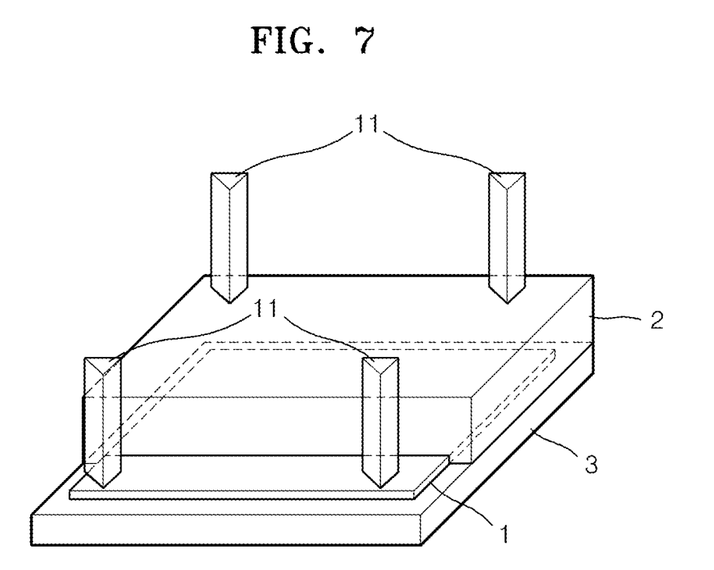
FIG. 7 is a view illustrating a 4-terminal assay of a heterogeneous laminate, according to Examples 1 and 2 to be described in greater detail below.

The electrical conductivities of the heterogeneous laminates prepared in Example 1 and Comparative Example 1 were measured according to the van der Pauw method illustrated in FIG. 7. Referring to FIG. 7, graphene 1 and a thermoelectric inorganic material film 2 were stacked on a Si/SiO2 substrate 3, and a portion of the graphene 1 was exposed. 4 probes 11 were installed on the exposed portion of the graphene 1 and the thermoelectric inorganic material film 2 to measure the electrical conductivity. Accordingly, the electrical conductivities were measured in the in-plane direction (basal plane) and the out-of-plane direction.

Experimental Example 2: Electrical Conductivity Measurement (in-Plane Direction)

The electrical conductivity was measured in the same manner as in Experimental Example 1, except that the 4 probes 11 were all located on top ends of the thermoelectric inorganic material film 2.

Experimental Example 3: Seebeck Coefficient Measurement (in Plane Direction and Out of Plane Direction)

The Seebeck coefficient of the heterogeneous laminates prepared according to Example 1 and Comparative Example 1 were measured according to the van der Pauw illustrated in FIG. 7.

Referring to FIG. 7, the graphene 1 and the thermoelectric inorganic material film 2 were stacked on the Si/SiO2 substrate 3, and a portion of the graphene 1 was exposed. The 4 probes 11 were installed on the exposed portion of the graphene 1 and the thermoelectric inorganic material film 2 to measure the Seebeck coefficient. Thus, the Seebeck coefficients were measured in the in-plane direction (basal plane) and the out-of-plane direction.

Experimental Example 4: Seebeck Coefficient Measurement (in Plane Direction)

The Seebeck coefficient was measured in the same manner as in Experimental Example 3, except that the 4 probes 11 were all located on top ends of the thermoelectric inorganic material film 2. Thus, the Seebeck coefficient was measured in the in-plane direction (basal plane).

The heat radiation-thermoelectric fin according to another embodiment of the present invention has increased electrical conductivity, Seebeck coefficient, and power factor compared to a conventional thermoelectric inorganic material. Accordingly, the heterogeneous laminate of the graphene and the thermoelectric inorganic material may have an excellent thermoelectric characteristic.

As described above, according to the one or more example embodiments, a heat radiation-thermoelectric fin is formed to have excellent thermoelectric conversion efficiency and is able to simultaneously perform heat radiation and thermoelectric generation. A thermoelectric module and a thermoelectric apparatus including the heat radiation-thermoelectric fin may be used for waste heat generation, thermoelectric nuclear generation for aircraft and airspace purposes, or the like.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A heat radiation-thermoelectric fin comprising:
a heterogeneous laminate of graphene and a thermoelectric inorganic material, and
a metal substrate on which the heterogeneous laminate is formed,
wherein the graphene of the heterogeneous laminate and the metal substrate directly contact each other,
wherein the thermoelectric inorganic material is epitaxially grown on the graphene; and
wherein the heterogeneous laminate has a superlattice structure.

2. The heat radiation-thermoelectric fin of claim 1, wherein the heat radiation-thermoelectric fin has a structure of a plurality of tubes or plates.

3. The heat radiation-thermoelectric fin of claim 1, wherein the metal substrate is a metal wire or a metal plate.

4. The heat radiation-thermoelectric fin of claim 1, wherein the metal substrate is formed of copper, aluminum, or an alloy thereof.

5. The heat radiation-thermoelectric fin of claim 1, wherein the graphene of the heterogeneous laminate comprises about 2 to 100 layers.

6. The heat radiation-thermoelectric fin of claim 1, wherein the thermoelectric inorganic material of the heterogeneous laminate has a p-type semiconductor property or an n-type semiconductor property.

7. The heat radiation-thermoelectric fin of claim 1, wherein the thermoelectric inorganic material has a crystal structure having an orientation in an out-of-plane direction perpendicular to the graphene.

8. A thermoelectric module comprising:
a heat transfer member; and
a heat radiation-thermoelectric fin having one end connected to a heat supplier,
wherein the heat radiation-thermoelectric fin comprises a heterogeneous laminate of graphene and a thermoelectric inorganic material, and a metal substrate on which the heterogeneous laminate is formed,
wherein the graphene of the heterogeneous laminate and the metal substrate directly contact each other,
wherein the thermoelectric inorganic material is epitaxially grown on the graphene; and
wherein the heterogeneous laminate has a superlattice structure.

9. The thermoelectric module of claim 8, wherein the heat radiation-thermoelectric fin has a structure of a plurality of tubes or plates.

10. The thermoelectric module of claim 8, wherein the metal substrate is a metal wire or a metal plate.

11. The thermoelectric module of claim 8, wherein the metal substrate is formed of copper, aluminum, or an alloy thereof.

12. The thermoelectric module of claim 8, wherein the heat transfer member is formed of copper, aluminum, or nickel.

13. A thermoelectric apparatus comprising:
a heat supplier; and
a thermoelectric module comprising
a heat transfer member, and
a heat radiation-thermoelectric fin having one end connected to the heat supplier,
wherein the heat radiation-thermoelectric fin comprises a heterogeneous laminate of graphene and a thermoelectric inorganic material, and a metal substrate on which the heterogeneous laminate is formed,
wherein the graphene of the heterogeneous laminate and the metal substrate directly contact each other,
wherein the thermoelectric inorganic material is epitaxially grown on the graphene; and
wherein the heterogeneous laminate has a superlattice structure.

14. The thermoelectric apparatus of claim 13, wherein the heat radiation-thermoelectric fin has a structure of a plurality of tubes or plates.

* * * * *